US006988247B2

(12) United States Patent
Janevski

(10) Patent No.: US 6,988,247 B2
(45) Date of Patent: Jan. 17, 2006

(54) GRAPHIC USER INTERFACE HAVING TOUCH DETECTABILITY

(75) Inventor: Angel Janevski, New York City, NY (US)

(73) Assignee: Koninklijke Philips Electronics N.V., Eindhoven (NL)

(*) Notice: Subject to any disclaimer, the term of this patent is extended or adjusted under 35 U.S.C. 154(b) by 584 days.

(21) Appl. No.: 10/174,284

(22) Filed: Jun. 18, 2002

(65) Prior Publication Data

US 2003/0231197 A1 Dec. 18, 2003

(51) Int. Cl.
*G06F 13/00* (2006.01)

(52) U.S. Cl. ...................................... 715/835; 345/169

(58) Field of Classification Search ................ 715/716, 715/771, 851, 835, 837, 839; 345/130, 123, 345/169
See application file for complete search history.

(56) References Cited

U.S. PATENT DOCUMENTS

| | | | | |
|---|---|---|---|---|
| 5,524,195 | A * | 6/1996 | Clanton et al. | 725/61 |
| 5,604,493 | A | 2/1997 | Behlke | |
| 5,907,375 | A | 5/1999 | Nishikawa et al. | |
| 6,164,853 | A | 12/2000 | Foote | |
| 6,198,481 | B1 * | 3/2001 | Urano et al. | 715/835 |
| 6,211,856 | B1 * | 4/2001 | Choi et al. | 345/666 |
| 6,368,730 | B1 | 4/2002 | Kishimoto et al. | |
| 2001/0017615 | A1 | 8/2001 | Lin et al. | |

FOREIGN PATENT DOCUMENTS

| | | | |
|---|---|---|---|
| DE | 19962552 | A | 7/2001 |
| EP | 1047034 | A2 | 10/2000 |
| JP | 08076978 | | 3/1996 |

* cited by examiner

*Primary Examiner*—Cao (Kevin) Nguyen
(74) *Attorney, Agent, or Firm*—Edward W. Goodman

(57) ABSTRACT

A control panel for an electrical/electronic device allows a user to use the control panel without looking at the control panel. The control panel is formed by a graphic user interface (GUI) having a display for displaying various control icons for controlling the device. The display is touch sensitive so that a user is able to select the control function by pressing on the appropriate control icon. The display further has touch detectability for enabling a user to distinguish between the icons by touch. The touch detectability may be in the form of the surface of the display having raised portion in the vicinity of the control icons. While the positioning of the raised portions may be fixed, to allow for changing layouts of the control icons, the display may be flexible and an array of actuators may underlie the display whereby the actuators are selectively activated to press against the underside of the display thereby raising the upper surface of the display in the vicinities of the control icons.

6 Claims, 4 Drawing Sheets

GRAPHIC USER INTERFACE HAVING TOUCH DETECTABILITY

BACKGROUND OF THE INVENTION

1. Field of the Invention

The subject invention relates to control panels having a flat panel graphic user interface (GUI). The invention further relates to a remote control having such a control panel.

2. Description of the Related Art

Consumer electronics devices are often provided with remote control units for controlling the device from the comfort of one's easy chair. These remote control units typically are rectangular in shape and carry a plurality of buttons for operating the various control functions of the electronic devices.

However, as the user acquires more and more devices, these remote control units start to accumulate leaving an array of remote control units on the user's coffee table with the problem of selecting the appropriate remote control unit for controlling the desired device.

This problem has been addressed with universal remote control units which either include or may be programmed with the codes for controlling a plurality of different devices in a plurality of different device categories. As such, a user of such a universal remote control unit may control his/her stereo system, television receiver, video cassette recorder, DVD player, CD player, cable box, satellite receiver, etc., using the one universal remote control unit.

Quite naturally, it has now become a feat to design such a universal remote control unit which can be intuitively used to control all of these devices.

U.S. Pat. No. 5,956,025 discloses a remote control unit with 3D organized graphic user interface (GUI) for a home entertainment system which includes a GUI in the form of, for example, a liquid crystal display (LCD) with touch sensitivity in which various icons are displayed on the GUI and represent various control functions which the user selects in order to operate the various control functions of the various devices.

FIGS. 1 and 2 show an example of a remote control unit having such a GUI in the form of a touch sensitive LCD, which is marketed by Philips Electronics. As shown in FIG. 1, this remote control unit 10 includes an infrared transmitter for transmitting infrared control signals to the devices to be controlled. The remote control unit 10 includes a plurality of hard switches including a "MUTE" button 14, channel "UP" (16) and "DOWN" (18) buttons, volume "UP" (20) and volume "DOWN" (22) buttons, "RIGHT" (24) and "LEFT" (26) buttons for moving a cursor, and a "BACKLIGHT" button (28). The remote control unit 10 further includes a GUI in the form of a liquid crystal display 30 which displays various control icons for the device to be controlled. As shown in FIG. 1, the controlled device is a television receiver and the control icons include, e.g., "ON" (32) and the number "1" (34).

FIG. 2 shows the remote control unit 10 of FIG. 1, now set to control a DVD player, and has various control icons, e.g., "ON" (32), "REWIND" (36), and "PLAY" (38).

However, one problem with these types of remote control units is that it is necessary for the user to look at the remote control unit in order to operate it. While this may not be a problem when using the remote control unit to operate an audio device, such as, a CD player, when the user is watching television, in many cases, the illumination in the room is dimmed to enhance the picture. As such, it is then difficult to discern the markings on the display of the remote control unit. While, for example, the remote control unit 10 of FIGS. 1 and 2 includes the button 28 for activating a back light for the display, the user still must take his/her eyes off of the television in order to reliably operate the remote control unit.

SUMMARY OF THE INVENTION

It is an object of the invention to provide a control panel for an electrical/electronic device which allows a user to use the control panel without looking at the control panel.

This object is achieved in a control panel for an electrical/electronic device, said control panel comprising a graphic user interface (GUI) having a display for displaying various control icons representing various control functions for controlling the electrical/electronic device; means for rendering touch sensitivity to said display enabling a user of the control panel to select the desired control function by touching the respective control icon; and means for rendering touch detectability to the control icons on the display enabling a user to differentiate the various control icons by feel.

With such a control panel, after learning the layout of the control icons, the user is able to select the appropriate simply by detecting the icon by feel.

In a particular embodiment of the invention, the means for rendering touch detectability comprises changing a surface quality of the display at the control icons such that the control icons may be distinguished, by touch, from surrounding areas of the display, wherein the surface quality is an increased height of the display in the areas of the control icons.

As such, each control icon is distinguished by a raised portion of the display, similar to the buttons on a standard remote control unit. These raised portions may be formed into the upper surface of the display. However, this would not allow for changing the configuration, or placement, of the control icons on the display.

In response thereto, in a further particular embodiment of the invention, the display is flexible, and the means for rendering touch detectability comprises an array of actuators positioned beneath said flexible display, and control means for activating select ones of said actuators to locally deform the flexible display in the areas of the control icons.

As such, depending on the location of the control icons on the display, selected ones of the actuators are actuated to press against the underside of the display in the areas of the control icons causing the upper surface of the display to be raised wherever the control icons are arranged.

BRIEF DESCRIPTION OF THE DRAWINGS

With the above and additional objects and advantages in mind as will hereinafter appear, the subject invention will be described with reference to the accompanying drawings, in which.

DESCRIPTION OF THE PREFERRED EMBODIMENTS

Figure 3:
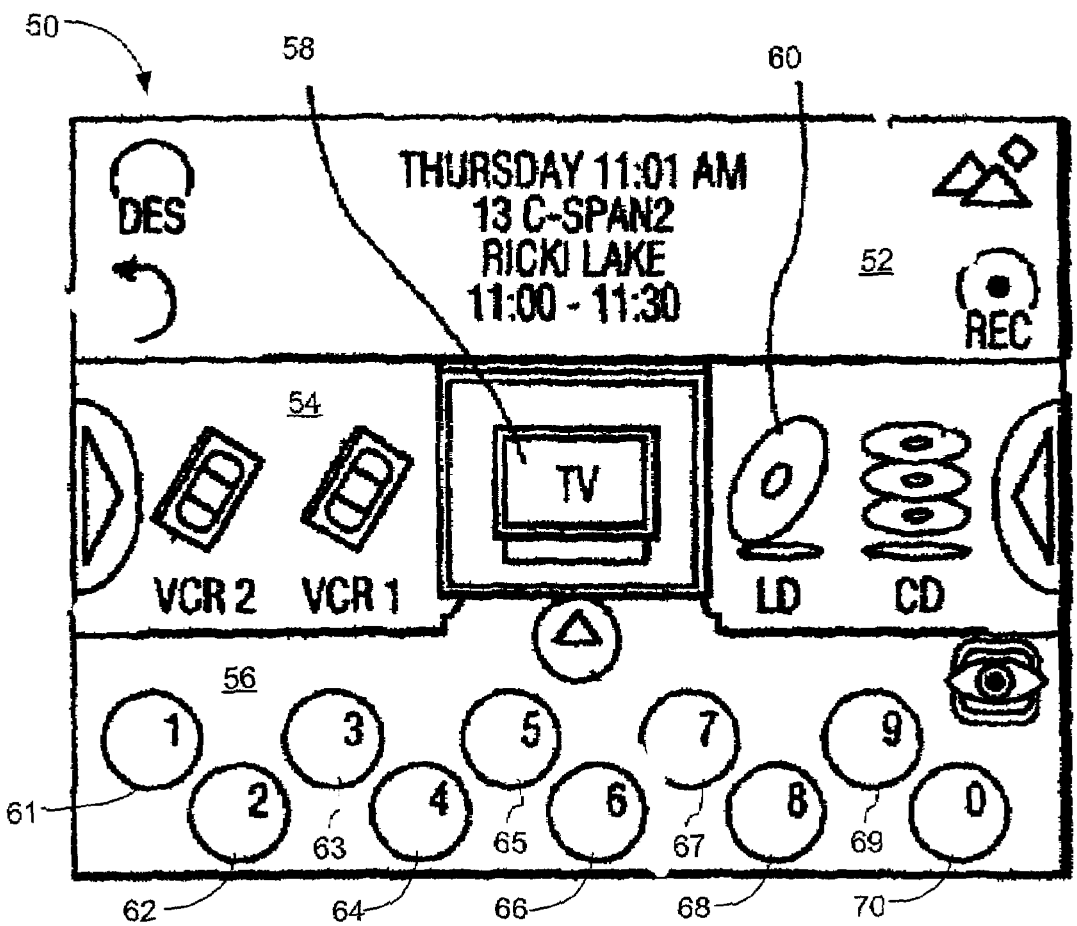
FIG. 3 shows a plan view of a remote control unit having a GUI which incorporates the subject invention.

FIG. 3 shows the GUI 50 of a remote control unit incorporating the subject invention. The GUI includes three regions, an information section 52 which includes information for the selected device, a device selection section 54 for displaying control icons for selecting the desired device, e.g., TV 58 and LD (laser disc) 60, and a control function section 56 for displaying control icons for controlling the desired device, in this case, numbers 1–0 icons 61–70.

Figure 4:
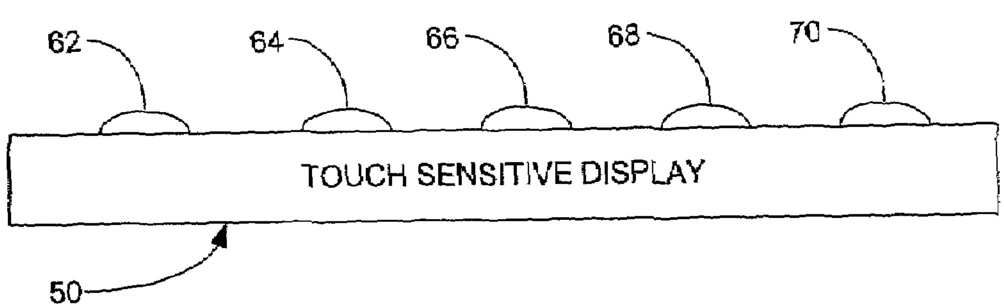
FIG. 4 shows an edge view of the GUI of the remote control unit of FIG. 3 incorporating a first embodiment of the subject invention.

FIG. 4 shows an edge view of the GUI 50 where it will be apparent that surface of the GUI in the vicinity of the icons 62, 64, 66, 68 and 70 is raised. It should be understood that while FIG. 4 only shows some of the icons being raised, the surface of the GUI in the vicinity of other icons, including 58, 60, 61, 63, 65, 67 and 69, may also be raised.

Once a user of the remote control unit 50 is familiar with the layout of the control icons, the user is then able to select the appropriate icon by merely sliding his/her finger across the surface of the GUI thereby detecting the raised areas and then selecting the desired control icon represented by the appropriate raised area.

While this embodiment of the invention allows for a user to discern the various control function by touch, when the raised areas are formed in the surface of the GUI, the layout of the control icons on the display may not be changed.

Figure 5:
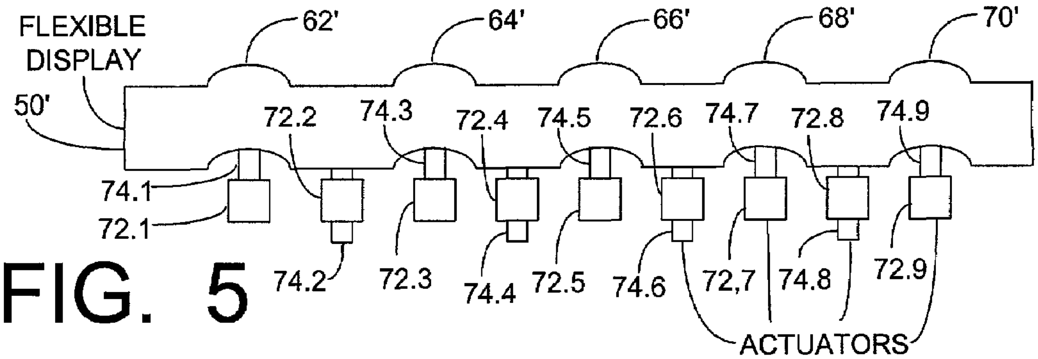
FIG. 5 shows an edge view of the GUI of the remote control unit of FIG. 3 incorporating a second embodiment of the subject invention.

FIG. 5 shows a second embodiment of the invention in which the touch sensitive display is a flexible display. U.S. Pat. No. 6,368,730 discloses an electroluminescent device which is flexible and may be used for the display in the GUI 50'. The raised portions 62', 64', 66', 68' and 70 are formed by actuators 72.0–72.9 arranged beneath the flexible display 50'. Each of the actuators 72.0–72.9 includes a pusher rod 74.1–74.9 which, upon activation of the respective actuator, presses on the under-surface of the flexible display 50'. Hence, in order to accommodate the icons forming the numbers “2”, “4”, “6”, “8” and “0”, as shown in the GUI 50 of FIG. 3, the actuators 72.1, 72.3, 72.5, 72.7 and 72.9 are activated, while the actuators 72.2, 72.4, 72.6 and 72.8 are deactivated.

Figure 6:
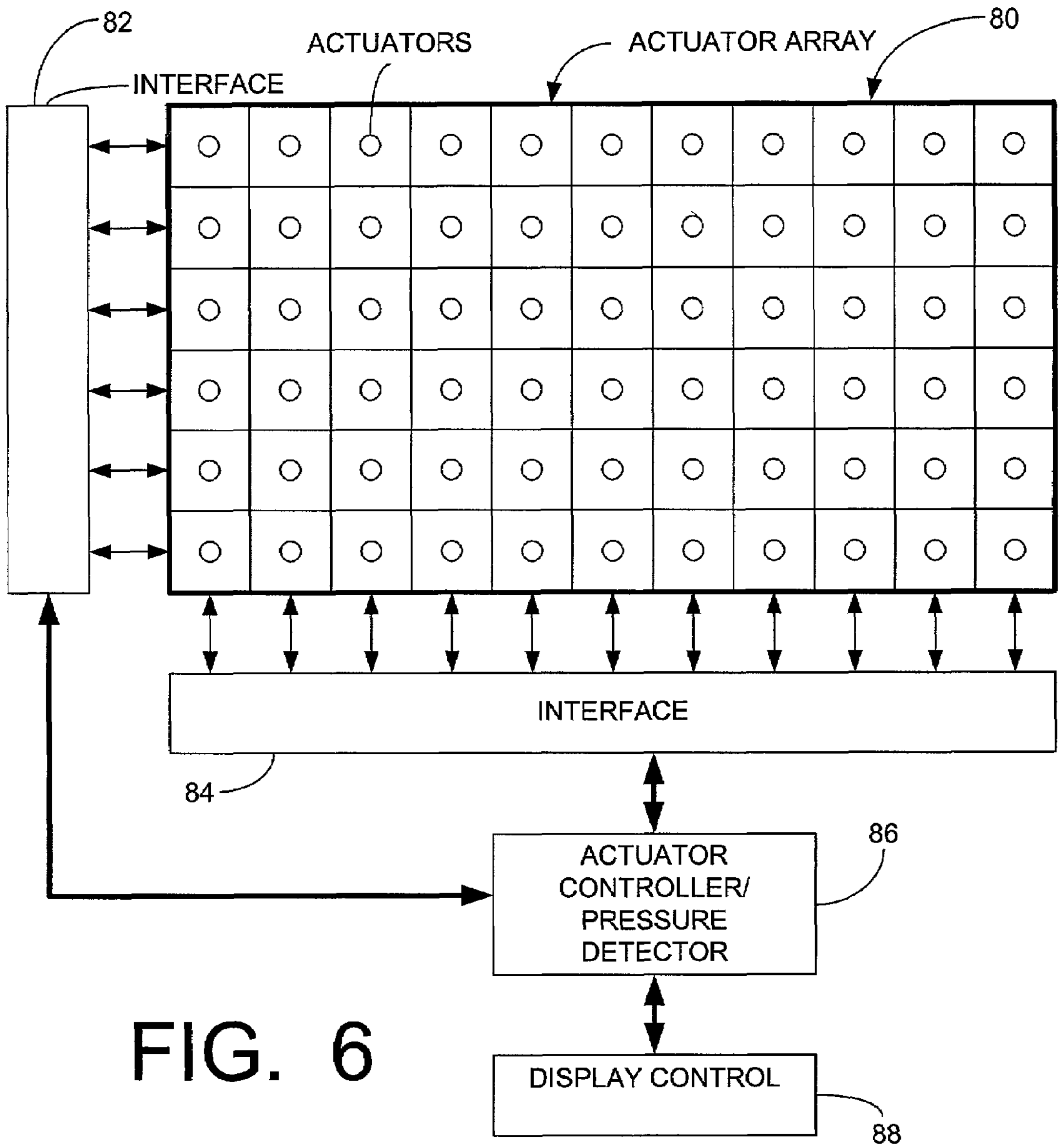
FIG. 6 show an array of actuators and a block diagram for controlling the actuators.

In order to accommodate various layouts of control icons on the flexible display 50', as shown in FIG. 6, the actuators may be arranged in an actuator array 80 forming a matrix having a plurality of rows of actuators and columns of actuators. The rows of actuators in the actuator array 80 are addressed by a row interface 82, while the columns of actuators in the actuator array 80 are addressed by a column interface 84. An actuator controller 86 is then connected to the interfaces 82 and 84 for activating selected ones of the actuators corresponding to the location of the control icons as controlled by a display controller 88. With such an arrangement, small control icons may be raised using a single actuator, while larger control icons may be raised using multiple adjacent actuators. In fact, if the actuators are sufficiently small, a plural number of actuators may be used to form a raised distinguishable shape for the icon (e.g., an arrow), or may be used to form a type of rocker switch.

While the invention so far has been described in the sense of forming raised areas on the surface of the display, it should be understood that, instead, depressions in the surface of the display by alternatively be formed. To this end, the pusher rods 74.1–74.9 of the actuators 72.1–72.9 are attached to the under-surface of the display 50'. Depending on the control signal applied to each actuator 72.1–72.9, the respective pusher rod 74.1–74.9 may press upwardly on the display (e.g., 74.1), remain in a neutral position (e.g., 74.2), or may pull down on the display.

While the invention contemplates touch sensitivity on the part of the display, it should be noted that this feature has not been disclosed for the electroluminescent device of U.S. Pat. No. 6,368,730. Hence, in order to provide for such, the actuator controller 86 may also detect pressure on, for example, the activated actuators, this pressure resulting from a user pressing the desired icon (note the two-way arrows connecting the interfaces 82 and 84 to the actuator array 80, and the two-way arrows connecting the interfaces 82 and 84 to the actuator controller 86).

Figure 1:
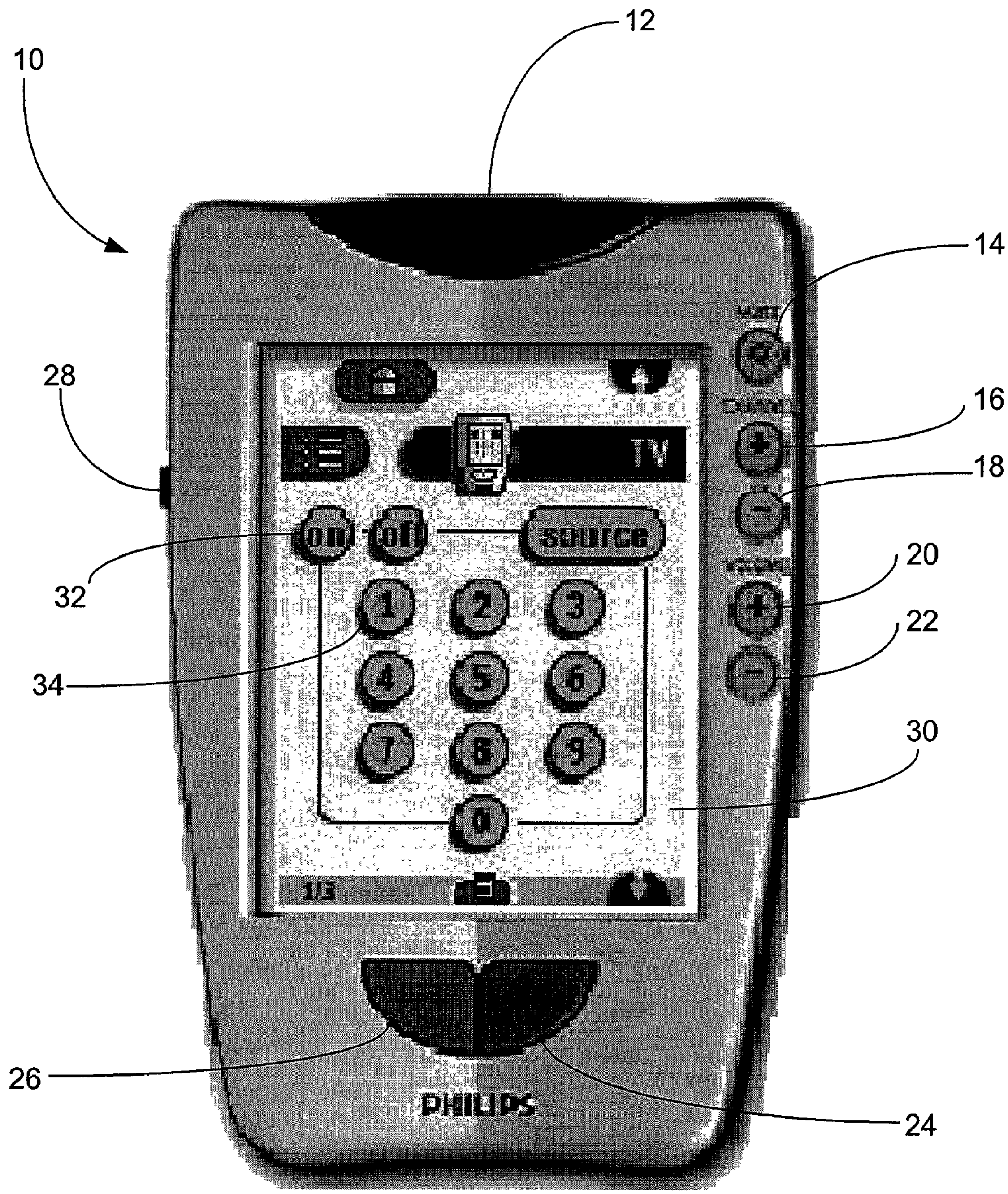
FIG. 1 shows a plan view of a known remote control unit having a graphic user interface (GUI) showing control icons for a television receiver.
Figure 2:
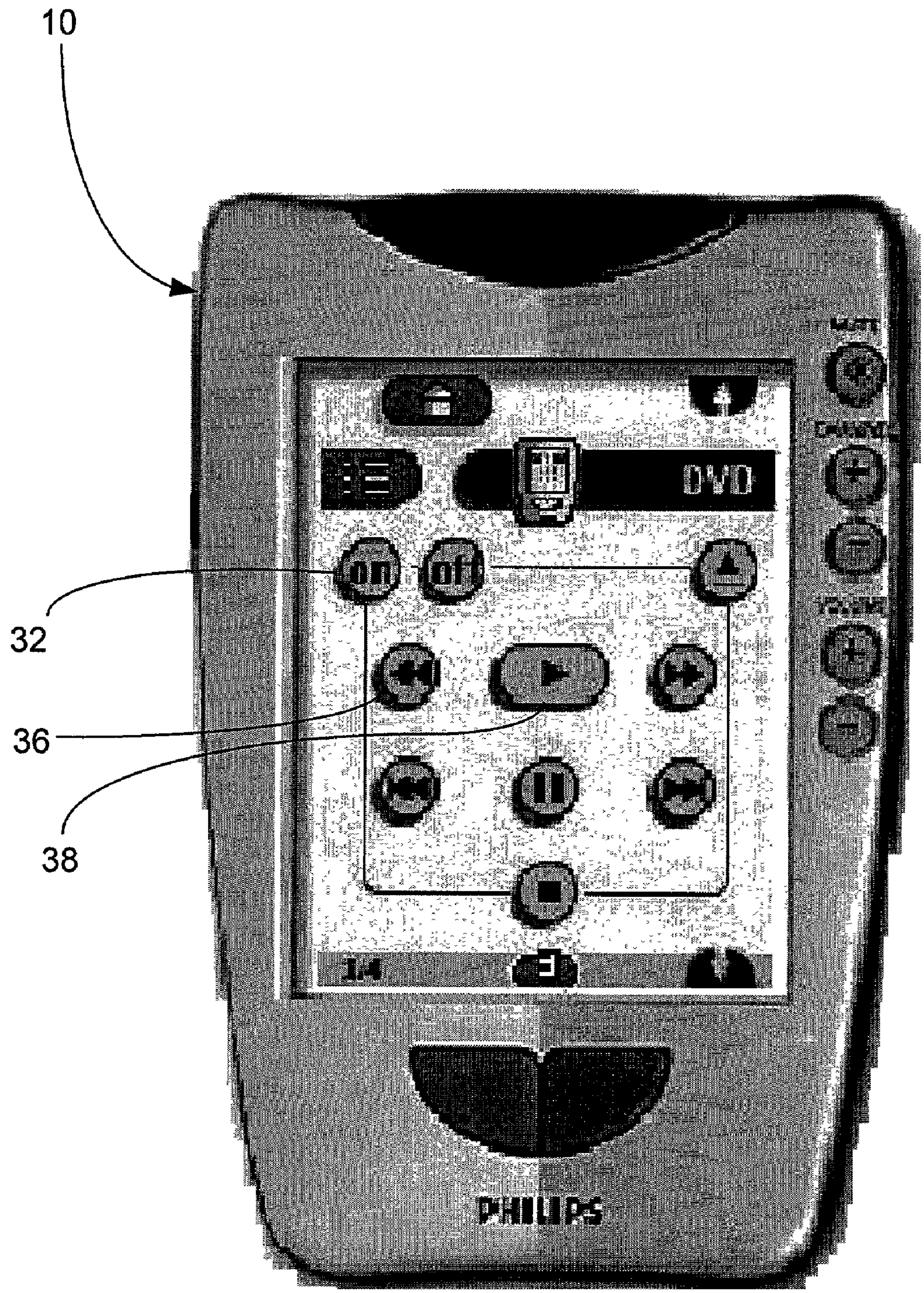
FIG. 2 shows a plan view of the remote control unit of FIG. 1 in which the GUI shows the control icons for a DVD player.

It should be noted that while the above description relates to the GUI layout as shown in FIG. 3, and in particular, to the bottom row of the GUI therein, the subject invention is applicable to other layouts. For example, the subject invention may be used to impart touch detectability to the display of the remote control unit shown in FIGS. 1 and 2. In particular, the small icons, e.g., 32, 34 and 36, may be accommodated by activating single actuators in the actuator array, while larger icons, e.g., 38, may be accommodated by activating two or more actuators.

Numerous alterations and modifications of the structure herein disclosed will present themselves to those skilled in the art. However, it is to be understood that the above described embodiment is for purposes of illustration only and not to be construed as a limitation of the invention. All such modifications which do not depart from the spirit of the invention are intended to be included within the scope of the appended claims.

What is claimed is:

1. A control panel for an electrical/electronic device, said control panel comprising:

a graphic user interface (GUI) having a display for displaying various control icons representing various control functions for controlling the electrical/electronic device;

means for rendering touch sensitivity to said display enabling a user of the control panel to select the desired control function by touching the respective control icon; and means for rendering touch detectability to the control icons on the display enabling a user to differentiate the various control icons by feel.

2. The control panel as claimed in claim 1, wherein said means for rendering touch detectability comprises changing a surface quality of said display at said control icons such that said control icons may be distinguished, by touch, from surrounding areas of the display.

3. The control panel as claimed in claim 2, wherein said surface quality is an increased height of the display in the areas of the control icons.

4. The control panel as claimed in claim 2, wherein said surface quality is a lowering of the height of the display in the areas of the control icons.

5. The control panel as claimed in claim 2, wherein said display is flexible, and wherein said means for rendering touch detectability comprises an array of actuators positioned beneath said flexible display, and control means for activating select ones of said actuators to locally deform the flexible display in the areas of the control icons.

6. The control panel as claimed in claim 5, wherein said means for rendering touch sensitivity comprises:

means for detecting pressure on various ones of said select ones of said actuators resulting from a user pressing a corresponding control icon; and means for identifying the selected control function.

* * * * *